United States Patent
Lovas

(10) Patent No.: US 11,296,493 B2
(45) Date of Patent: Apr. 5, 2022

(54) APPARATUSES AND METHODS INVOLVING MODULATION AND ASSESSMENT OF CURRENT PATHS OF AN ELECTRONIC CIRCUIT BREAKER

(71) Applicant: NXP USA, INC., Austin, TX (US)

(72) Inventor: Ivan Lovas, Prievidza (SK)

(73) Assignee: NXP USA, Inc., Austin, TX (US)

(*) Notice: Subject to any disclaimer, the term of this patent is extended or adjusted under 35 U.S.C. 154(b) by 315 days.

(21) Appl. No.: 16/180,291

(22) Filed: Nov. 5, 2018

(65) Prior Publication Data
US 2020/0144811 A1   May 7, 2020

(51) Int. Cl.
| | |
|---|---|
| *H02H 7/18* | (2006.01) |
| *G01R 31/00* | (2006.01) |
| *G01R 31/327* | (2006.01) |
| *H02H 1/00* | (2006.01) |

(52) U.S. Cl.
CPC ............. *H02H 7/18* (2013.01); *G01R 31/007* (2013.01); *G01R 31/3277* (2013.01); *H02H 1/0007* (2013.01)

(58) Field of Classification Search
CPC ...... H02H 7/18; H02H 1/0007; G01R 31/007; G01R 31/3277; G01R 31/3648
See application file for complete search history.

(56) References Cited

U.S. PATENT DOCUMENTS

| | | | |
|---|---|---|---|
| 9,864,008 B2 | 1/2018 | Biswas et al. | |
| 2002/0057542 A1 | 5/2002 | Colling | |
| 2011/0234110 A1* | 9/2011 | Liu | H05B 45/46 315/186 |
| 2013/0057297 A1* | 3/2013 | Cheng | G01R 31/64 324/548 |
| 2016/0190926 A1* | 6/2016 | Ni | H02M 3/158 323/271 |
| 2017/0025950 A1* | 1/2017 | Wu | H02M 3/158 |
| 2017/0261562 A1* | 9/2017 | Honda | G01R 35/00 |
| 2017/0269611 A1* | 9/2017 | Rangarajan | B64F 5/60 |
| 2018/0301987 A1* | 10/2018 | Abe | H02M 1/36 |

FOREIGN PATENT DOCUMENTS

| | | |
|---|---|---|
| JP | 2001045648 | 2/2001 |
| WO | WO2016037880 A1 | 3/2016 |

* cited by examiner

*Primary Examiner* — Nguyen Tran
*Assistant Examiner* — Trinh Q Dang

(57) ABSTRACT

An example apparatus is for use with an electronic circuit breaker having a plurality of current paths connected between a connection terminal to a power source and a load terminal. The apparatus includes power access circuitry and control circuitry. The power access circuitry monitors circuit access of power via the power source by modulating use of the plurality of current paths of the electronic circuit breaker while assessing actual usage of the power source via a power-related parameter relative to expected usage of the power source. The control circuitry responds to the assessment by generating a signal indicative of a diagnostic result associated with operation of the electronic circuit breaker.

22 Claims, 3 Drawing Sheets

APPARATUSES AND METHODS INVOLVING MODULATION AND ASSESSMENT OF CURRENT PATHS OF AN ELECTRONIC CIRCUIT BREAKER

OVERVIEW

Aspects of various embodiments are directed to modulating use of current paths of an electronic circuit breaker, and assessing usage of a power source in response thereto.

Circuit breakers are used in a wide variety of applications to disconnect electric power in the case of a fault. Circuit breakers can be mechanical circuit breakers having mechanical relays or electrical circuit breakers having semiconductor switches. For voltages over 12 volts, a circuit breaker can be equipped with a pre-charge circuit that allows for a soft-turn of the current path to avoid current peaks. Mechanical circuit breakers can have shorter lifetime and higher costs than electronic circuit breakers.

These and other matters have presented challenges to efficiencies of electronic circuit breaker implementations, for a variety of applications.

SUMMARY

Various example embodiments are directed to issues such as those addressed above and/or others which may become apparent from the following disclosure concerning assessment of current paths of an electronic circuit breaker via modulations of the respective current paths.

In certain example embodiments, aspects of the present disclosure involve modulating the current paths via a predefined pattern that sequentially disables current flow to less than all of the plurality of current paths and assessing the electronic circuit breaker based on resulting power usage during the predefined pattern.

A specific example embodiment is directed to an apparatus for use with an electronic circuit breaker having a plurality of current paths. The current paths are connected between a connection terminal connected to a power source and a load terminal. The apparatus includes power access circuitry and control circuitry. The power access circuitry monitors circuit access of power via the power source by modulating use of the plurality of current paths of the electronic circuit breaker while assessing actual usage of the power source via a power-related parameter relative to expected usage of the power source. The control circuitry responds to the assessment by generating a signal indicative of a diagnostic result associated with operation of the electronic circuit breaker.

The apparatus can include a field-effect power switch in each of the plurality of current paths and can further include the power source, such as one or more batteries. The power access circuitry modulates use of the plurality of current paths by selectively disabling current flow relative to less than all of the plurality of current paths. The modulated use of the plurality of current paths of the electronic circuit breaker can be provided via a predefined switching pattern associated with the field-effect power switches that selectively disables current flow to less than all of the plurality of current paths. The power access circuitry can include a sequencer circuit that generates and provides the predefined switching pattern. The predefined switching pattern associated with the field-effect power switches can selectively deactivate one or more of the field-effect power switches while activating at least one of the field-effect power switches.

Modulating the use of the plurality of current paths of the electronic circuit breaker can include selectively deactivating one or more of the field-effect power switches while activating one of the field-effect power switches. In some embodiments, to increase the resolution, more than one of the field-effect power switches can be deactivated at a time during the modulation. In other embodiments and/or in addition, the power access circuitry can connect the plurality of current paths to another load terminal during the modulation of the use of the plurality of current paths to increase the resolution. In various specific embodiments, during the activation of the field-effect power switches, the field-effect power switches can be linearly controlled to provide a soft turn-on.

The control circuit can generate the signal indicative of a detected fault associated with at least one of the plurality of current paths based on the assessment. In some specific embodiments, the apparatus includes vehicle electronics, and a safety-module circuit coupled to the vehicle electronics. The safety-module circuit and the vehicle electronics can use the signal indicative of the diagnostic result to cause vehicle electronics to enter into a safety vehicle-operation mode.

Another specific embodiment is directed a non-transitory computer readable medium containing program instructions, which when executed by a processor cause the processor to perform a method including causing modulated use of a plurality of current paths of an electronic circuit breaker, the current paths being connected between a connection terminal to a power source and a load terminal coupled to electronics; assessing actual usage of the power source via a power-related parameters relative to expected usage of the power source during the modulation; and generating, in response to the modulation and assessment, a signal indicative of a diagnostic result associated with operation of the electronic circuit breaker and selectively using the signal to control operation of the electronics.

Other related embodiments are directed to methods of diagnostics of an electronic circuit breaker. The method can be implemented in an apparatus for use with an electronic circuit breaker having a plurality of current paths connected between a connection terminal to a power source and a load terminal coupled to electronics. The method includes monitoring circuit access of power via the power source by modulating use of the plurality of current paths of the electronic circuit breaker while assessing actual usage of the power source via a power-related parameter relative to expected usage of the power source. The method further includes generating, in response to the modulation and assessment, a signal indicative of a diagnostic result associated with operation of the electronic circuit breaker and selectively using the signal to control operation of the electronics.

The modulation can include selectively activating and deactivating respective field-effect power switches in each of the plurality of current paths. For example, current flow through each current path of the plurality of current paths can be selectively enabled while disabling current flow through at least one of the remaining plurality of current paths. In specific embodiments, the electronic circuit breaker includes at least two field-effect power switches and modulating the use of the plurality of current paths of the electronic circuit breaker includes selectively deactivating at least one of the field-effect power switches while activating at least one of the field-effect power switches. In other specific embodiments, the method further includes connecting the plurality of current paths to another load terminal during the modulated use of the plurality of current paths.

The assessment of the actual usage of the power source via the power-related parameter can include measuring a voltage drop and current associated with sequential activation of current flow through each current path of the plurality of current paths, while disabling current flow through at least one of the remaining plurality of current paths. The voltage drop and the current associated with the sequential activation of current flow can be measured using different amplifiers. Assessing actual usage of the power source can include determining the actual resistance of the circuit breaker using a voltage drop and current associated with the modulated use of the plurality of current paths and comparing the actual resistance values to expected resistance values according to the number of active field-effect power switches.

The output signal can be used to place the apparatus in a safety-operation mode. The safety-operation mode can include at least one of outputting an alert, disabling a function and limiting a value of a function provided by the electronics.

In a number of embodiments, during the diagnostic pattern, the method further includes softly turning on the field-effect power switches to improve electromagnetic compatibility (EMC) behavior without the use of a pre-charge circuit. For example, the modulation can include selectively activating the field-effect power switches using linear control of the field-effect power switches, wherein a deactivated field-effect power switch is activated over a threshold period of time.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
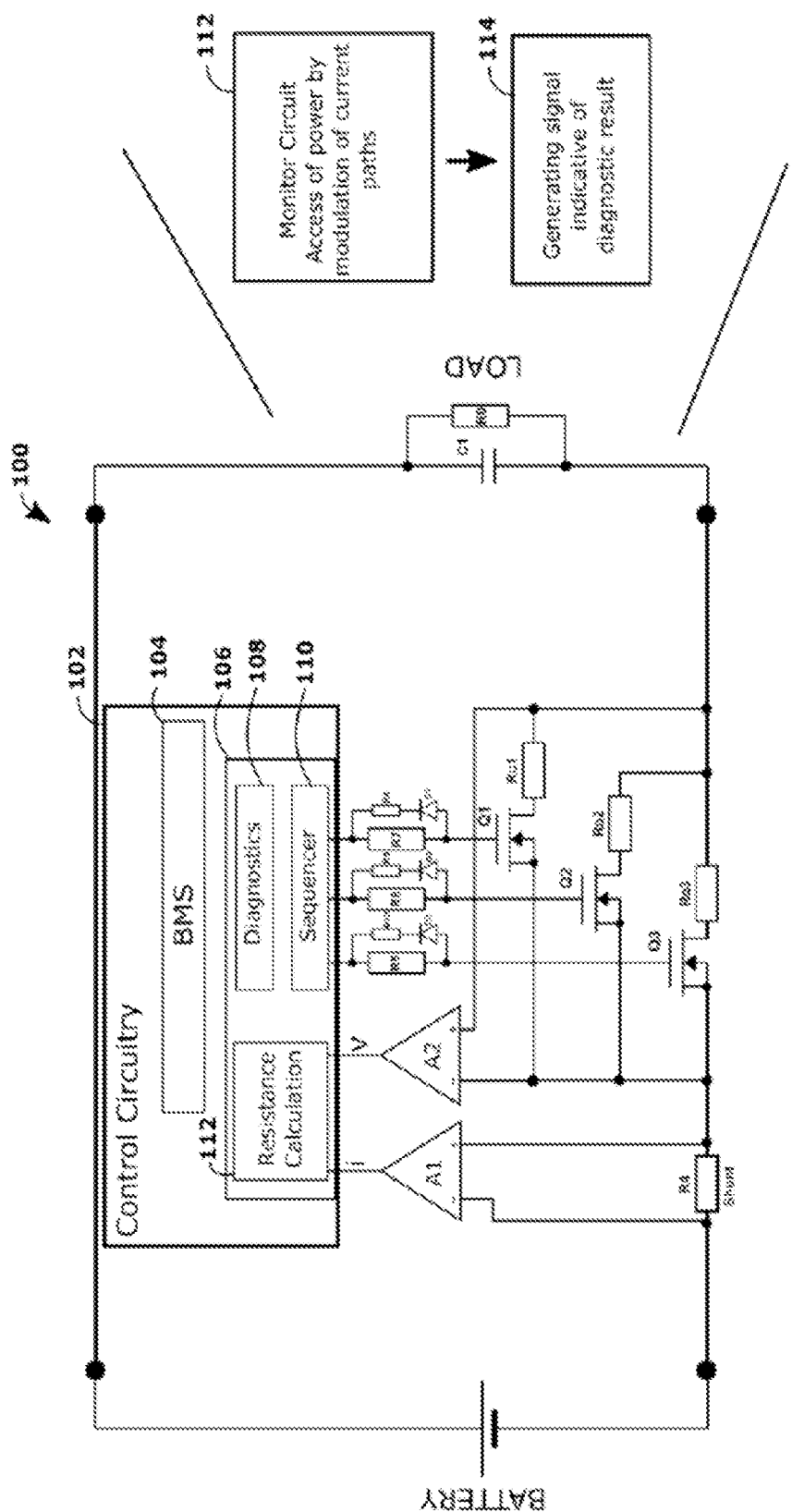
FIG. 1 illustrates an example apparatus, in accordance with various specific embodiments.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving assessment of current paths of an electronic circuit breaker by modulating use of the current paths and comparing the resulting usage of the power source to an expected usage. In certain implementations, aspects of the present disclosure have been shown to be beneficial when used in the context of electronic circuit breakers used in battery management systems (BMS) and that have a plurality of field-effect power switches. The assessment of the electronic circuit breaker can involve a predefined switching pattern associated with the field-effect power switches that selectively disables current flow to the less than all of the current paths, and which can be used to identify failure of one or more of the field-effect power switches. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Circuit breakers can be used for a wide variety of vehicle BMS or DC/DC converters and other applications to disconnect electric power in the cause of a fault. In many applications, due to currents that are relatively high (e.g., 100 A or higher), electronic circuit breakers are made of serval semiconductor power switches, herein referred to as field-effect power switches. The field-effect power switches can have drains and sources connected in parallel with separate gate control. The number of field-effect power switches can vary from two to more than ten switches. The field-effect power switches are parallel switches having independent control paths via their gates. Field-effect power switches, however, can have high current peaks when activated from a deactivated states, which can be avoided or mitigated by a pre-charge circuit that allows for a soft turn-on of the switches (e.g., provides linear control of the activation). Embodiments in accordance with the present disclosure can involve assessing an electronic circuit breaker by modulating the current paths of the electronic circuit breaker and assessing power usage by the current paths as compared to an expected power usage. The assessment can be used to periodically verify functional safety levels, such as in accordance with a safety standard, and to indicate failures associated with the electronic circuit breaker. In some embodiments, the failure of a component of the electronic circuit breaker can trigger a safety-mode of operation of the apparatus, as further described herein. Further, during the modulations, the field-effect power switches can be linearly controlled to provide a soft-turn on and mitigate current peaks without the use of a pre-charge circuit.

In various embodiments, the electronic circuit breaker includes the field-effect power switches that have independent control paths. Control circuitry (e.g., microcontroller) can assess the electronic circuit breaker for a fault and/or to verify functional safety levels by applying a diagnostic pattern to the electronic circuit breaker to modulate use of the current paths. The diagnostic pattern can include a predefined switching pattern associated with the field-effect power switches that selectively disables current flow to less than all of the plurality of current paths. The control circuitry can assess actual power usage of a power source during the diagnostic pattern and compare the actual power usage to expected power usage, and generate a signal indicative of a diagnostic result in response thereto. The assessment of actual usage of the power source can be based on an actual resistance calculated using a power-related parameter, such as current and/or voltage drop across the electronic circuit breaker. The actual resistance is compared to an expected resistance calculated using defined resistances of the one or more field-effect power switches that are active. Each switch has a defined resistance when activated, e.g., in an on-state, and when deactivated, e.g., in an off-state. The defined expected resistances can allow for calculation of the expected resistance according to the number of active switches and the defined resistances of the switches. As described above, during the diagnostic pattern, the field-effect power switches can be softly activated to improve electromagnetic compatibility (EMC) behavior without the use of a pre-charge circuit. The diagnostics can be provided periodically, and is not limited to assessment when the apparatus is in a standby mode.

A number of embodiments are directed to an apparatus for use with an electronic circuit breaker having a plurality of current paths. The current paths are connected between a connection terminal connected to a power source and a load terminal. The apparatus includes power access circuitry and control circuitry. The power access circuitry monitors circuit access of power via the power source by modulating use of the plurality of current paths of the electronic circuit breaker while assessing actual usage of the power source via a power-related parameter relative to expected usage of the power source. The control circuitry responds to the assessment by generating a signal indicative of a diagnostic result associated with operation of the electronic circuit breaker.

In various embodiments, the apparatus includes a field-effect power switch in each of the plurality of current paths. The apparatus can further include the power source, which can include one or more batteries, such as batteries that can be recharged. The power access circuitry modulates use of the plurality of current paths by selectively disabling current flow relative to less than all of the plurality of current paths. The modulated use of the plurality of current paths of the electronic circuit breaker can be provided via a predefined switching pattern associated with the field-effect power switches that selectively disables current flow to less than all of the plurality of current paths. The predefined switching pattern associated with the field-effect power switches can selectively deactivate one or more of the field-effect power switches while activating at least one of the field-effect power switches.

In a number of embodiments, a resolution provided by deactivating one of the field-effect power switches can be below a threshold (e.g., the current and voltage drop is below a threshold). To increase the resolution, more than one of the field-effect power switches can be deactivated at a time during the modulation. In other embodiments and/or in addition, the power access circuitry can connect the plurality of current paths to another load terminal during the modulation of the use of the plurality of current paths to increase the resolution.

In various specific embodiments, during the activation of the field-effect power switch(es), the field-effect power switch(es) can be linearly controlled to provide a soft turn-on. For example, the modulation can include selectively activating the field-effect power switches using linear control, as further described herein.

The control circuit can generate the signal indicative of a detected fault associated with at least one of the plurality of current paths based on the assessment. For example, an actual power usage being outside an expected power usage can indicate one or more of the field-effect power switches is faulty and/or that the electronic circuit breaker is not complying with a functional safety level associated with a safety protocol. In some specific embodiments, the apparatus includes vehicle electronics, and a safety-module circuit coupled to the vehicle electronics. The safety-module circuit and the vehicle electronics use the signal indicative of the diagnostic result to cause vehicle electronics to enter into a safety vehicle-operation mode.

Various related and specific embodiments are directed to software implementations, such as software implemented by a microcontroller. The embodiments can include a non-transitory computer readable medium containing program instructions when executed by a processor cause the processor to perform a method including causing modulated use of a plurality of current paths of an electronic circuit breaker, the current paths being connected between a connection terminal to a power source and a load terminal coupled to electronics; assessing actual usage of the power source via a power-related parameters relative to expected usage of the power source during the modulation; and generating, in response to the modulation and assessment, a signal indicative of a diagnostic result associated with operation of the electronic circuit breaker and selectively using the signal to control operation of the electronics.

Other related embodiments are directed to methods of performing diagnostics on an electronic circuit breaker. The methods can be implemented in an apparatus for use with an electronic circuit breaker having a plurality of current paths connected between a connection terminal to a power source and a load terminal coupled to electronics. The method can include monitoring circuit access of power via the power source by modulating use of the plurality of current paths of the electronic circuit breaker while assessing actual usage of the power source via a power-related parameter relative to expected usage of the power source. The method further includes generating, in response to the modulation and assessment, a signal indicative of a diagnostic result associated with operation of the electronic circuit breaker and selectively using the signal to control operation of the electronics. The controlled operation can include a safety mode, is some specific embodiments and as further described herein.

The modulation, as previously described, can include selectively activating and deactivating respective field-effect power switches in each of the plurality of current paths. For example, current flow through each current path of the plurality of current paths can be selectively enabled while disabling current flow through at least one (or, optionally, at least two, in some embodiments) of the remaining plurality of current paths. In specific embodiments, the electronic circuit breaker includes at least two field-effect power switches and modulating the use of the plurality of current paths of the electronic circuit breaker includes selectively deactivating at least one (or more than one) of the field-effect power switches while activating at least one of the field-effect power switches. In other specific embodiments, the method further includes connecting the plurality of current paths to another load terminal during the modulation of the use of the plurality of current paths.

The assessment of the actual usage of the power source via the power-related parameter can include measuring a voltage drop and current associated with sequential activation of current flow through each current path of the plurality of current paths, while disabling current flow through at least one of the remaining plurality of current paths. The voltage drop and the current associated with the sequential activation of current flow can be measured using different amplifiers. In various embodiments, assessing actual usage of the power source includes determining the actual resistance of the circuit breaker using a voltage drop and current associated with the modulated use of the plurality of current paths and comparing the actual resistance to expected resistance values according to the number of active field-effect power switches and resistance of the field-effect power switches, such as given by datasheet or pre-calculated values stored in the table.

The output signal can be used to control operation of the electronics, such as placing an associated apparatus in a safety-operation mode. The safety-operation mode can include at least one of outputting an alert, disabling a function and limiting a value of a function provided by the electronics. Similarly, the output signal can be used to verify that the electronic circuit breaker is complying with a safety protocol.

In a number of embodiments, during the diagnostic pattern, the method further includes softly turning on the field-effect power switches to improve EMC behavior without the use of a pre-charge circuit. For example, the modulation can include selectively activating the field-effect power switches using linear control of the field-effect power switches, wherein a deactivated field-effect power switch is activated over a threshold period of time.

Turning now to the figures, FIG. 1 illustrates an example apparatus in accordance with various specific embodiments. The apparatus 100 can include power access circuitry 106 and control circuitry 102. The control circuitry 102 can include a microcontroller (MCU) that includes and/or uses the power access circuitry 106 to selectively activate and deactivate field-effect power switches of the electronic circuit breaker to assess the electronic circuitry breaker. For example, using the power access circuitry 106, the control circuitry 102 applies a diagnostic pattern to the electronic circuit breaker and analyses the results to detect faults within the circuit breaker and to improve EMC behavior.

The apparatus 100 is for use with and/or includes an electronic circuit breaker that has a plurality of current paths connected between a connection terminal to a power source (e.g., battery) and a load terminal (e.g., load). The electronic circuit breaker can be used to disconnect power, e.g., disconnect power from the power source to the load, in the case of a fault. The electronic circuit breaker can include a field-effect power switch in each of the current paths. In specific embodiments, the apparatus 100 further includes the power source, such as the illustrated battery. The battery can include one or more batteries, such as a main battery and auxiliary battery in a vehicle or other types of backup batteries.

The electronic circuit breaker can be assessed using the power access circuitry 106. The power access circuitry 106 monitors circuit access of power via the power source by modulating use of the plurality of current paths of the electronic circuit breaker. The modulated use of the current paths can include selective disablement of current flow relative to less than all of the plurality of current paths. As previously described, a field-effect power switch (e.g., Q1, Q2, Q3) can be in each of the plurality of current paths. The power access circuitry 106 can modulate the use of the current paths via a predefined switching pattern associated with the field-effect power switches that selectively disables current flow to less than all of the plurality of current paths. The power access circuitry 106 can include a sequencer circuit 110 used to generate and provide the predefined switching pattern.

In various embodiments, the electronic circuit breaker current may be below a threshold, and thus any voltage drop along the electronic circuit breaker may be below a threshold. The below threshold current and voltage drop may impact the ability of the power access circuitry 106 to assess the power usage. In order to increase resolution, the power access circuitry 106 can deactivate more than one field-effect power switch at a time during the diagnostics. For example, the power access circuitry 106 can modulate the use of the plurality of current paths of the electronic circuit breaker via a predefined switching pattern associated with the field-effect power switches that selectively deactivates (e.g., closes/turns off) more than one of the field-effect power switches while activating (e.g., opening/turning on) at least one of the field-effect power switches (e.g., turn more than one switch off while testing a respective switch to increase resolution/current). Although embodiments are not so limited and can include selectively deactivating one of the field-effect power switches while activating the other of the plurality of field-effect power switches.

In other embodiments and/or in addition, the power access circuitry 106 can improve resolution by connecting an additional load during the diagnostics. For example, the power access circuitry 106 connects the plurality of current paths to another load terminal during the modulation of the use of the plurality of current paths (e.g., thereby increasing the resolution/current). The current paths can be disconnected from the other load terminal after the diagnostics and/or the predefined switching pattern.

While modulating, the power access circuitry 106 assesses actual usage of the power source via a power-related parameter relative to expected usage of the power source. The power-related parameter refers to or includes power or a parameter that is at least partly indicative of a function of power, such as voltage, current and/or resistance. The assessment of actual usage of the power source can be based on an actual resistance calculated using a power-related parameter, such as current and/or voltage drop across the electronic circuit breaker. The actual usage of power, e.g., actual resistance, is compared to the expected usage such as comparing an expected resistance calculated using defined resistances of the one or more field-effect power switches that are active. As previously described, and as may be appreciated, to activate a switch includes or refers to decreasing internal resistance to lowest possible value and thus allows current to flow though. A faulty field-effect power switch may allow current to flow through when deactivated and/or may not allow current to flow through when activated.

As illustrated, the power access circuitry 106 can include a resistance calculation circuit 112 that calculates the actual resistance based on the voltage drop and current through each of the modulated current paths. A diagnostics circuit 108 can compare the actual resistance to an expected resistance according to the number of field-effect power switches that are activated and the defined resistance values of the field-effect power switches. The expected resistance values are calculated by a datasheet or pre-calculated values stored in a table, such as a memory of the power access circuitry 106 or control circuitry 102. Although FIG. 1 illustrates a power access circuitry 106 that includes a plurality of different circuits, as may be appreciated, the power access circuitry 106 may include one circuit (e.g., processing circuit of the controller circuitry 102) that performs the described functions of the sequencer circuit 110, diagnostic circuit 108, and/or the resistance calculation circuit 112.

In the specific embodiments of FIG. 1, the apparatus 100 includes a battery management system (BMS) 104 having the electronic circuit breaker with three field-effect power switch switches Q1, Q2, Q3 and the diagnostics provided by the power access circuitry 106. The R4 represent current measurement shunt resistor, resistors RQ1, RQ2, RQ3 represents internal resistance of switches Q1, Q2, Q3 and R0, C1 represent load. The control circuitry 102 and the power access circuitry 106 activate and deactivate Q1, Q2, Q3 switches using gate control signals.

When some of switches are activated, current from the battery flows through shunt resistor R4 and active Qn switches into the load. This current is measured by amplifier A1. Another amplifier A2 is used to measure voltage drop along all field-effect power switches. Both amplifiers can send measured values of voltage drop and current to the control circuitry 102, where resistance calculation is performed.

The control circuitry 102 responds to the assessment by generating a signal indicative of a diagnostic result associated with operation of the electronic circuit breaker. The signal can be indicative of a detected fault associated with at least one of the plurality of current paths. As illustrated by FIG. 1, and described above, the control circuitry 102 can include non-transitory computer readable medium containing program instructions that when executed cause the control circuitry modulate use of a plurality of current paths of an electronic circuit breaker, the current paths being connected between a connection terminal to a power source and a load terminal coupled to electronics, and assess actual usage of the power source via a power-related parameters relative to expected usage of the power source during the modulation at 112. Further, at 114, the control circuitry 102 generates, in response to the modulation and assessment, a signal indicative of a diagnostic result associated with operation of the electronic circuit breaker and selectively use the signal to control operation of the electronics.

In a specific embodiments, the apparatus 100 includes vehicle electronics and a safety-module circuit coupled to the vehicle electronics. The safety-module circuit can include the BMS 104 or another circuit in communication with the control circuitry 102. The vehicle electronics and safety-module circuit cooperatively use the signal indicative of the diagnostic result to cause the vehicle electronics to enter into a safety vehicle-operation mode. As a specific example, the BMS 104 can place the vehicle in a safety vehicle-operation mode that includes at least one of outputting an alert, disabling a function and/or limiting a value of a function provided by the electronics (e.g., notify driver of error on screen, limit speed, limit gears, turn off car, output message to external circuitry). As may be appreciated, a vehicle placed in a safety vehicle-operation mode can be limited in speed and/or gears, which is sometimes referred to as a "limp mode."

The apparatus illustrated by FIG. 1 can allow for electronic circuit breaker resistance modulation and measurement by using predefined switching patterns generated by the sequencer circuit 110. Measured current and voltage drop along this circuit breaker is used to determine actual resistance, which is compared with an expected resistance value. The expected resistance value can be calculated according to number of active switches and resistance of every switch given by datasheet or pre-calculated values stored in the table. This approach can be used to detect fault of any switching element within the electronic circuit breaker.

In various specific embodiments, using linear control of the field-effect power switches, circuit breaker soft-turn on/off can be achieved. As previously described, when a field-effect power switch is switched from a deactivated state to an activated state, a current peak can occur. To prevent or mitigate the current peak, and without the use of a pre-charge circuit, the modulation can include selectively activating the field-effect power switches using linear control of the field-effect power switches, thereby providing the soft-turn on. The linear control can include activating a deactivated field-effect power switch over a threshold period of time (e.g., slowly opening the switch to prevent a current peak). To achieve a difference between on and off switching times, example circuit (consist of R5-R10 D1-D3) can be used. This type of diagnostic can have negative impact to total power losses along electronic circuit breaker, however due to very short diagnostic time and long diagnostic period this impact can be very small and can be ignored.

Figure 2:
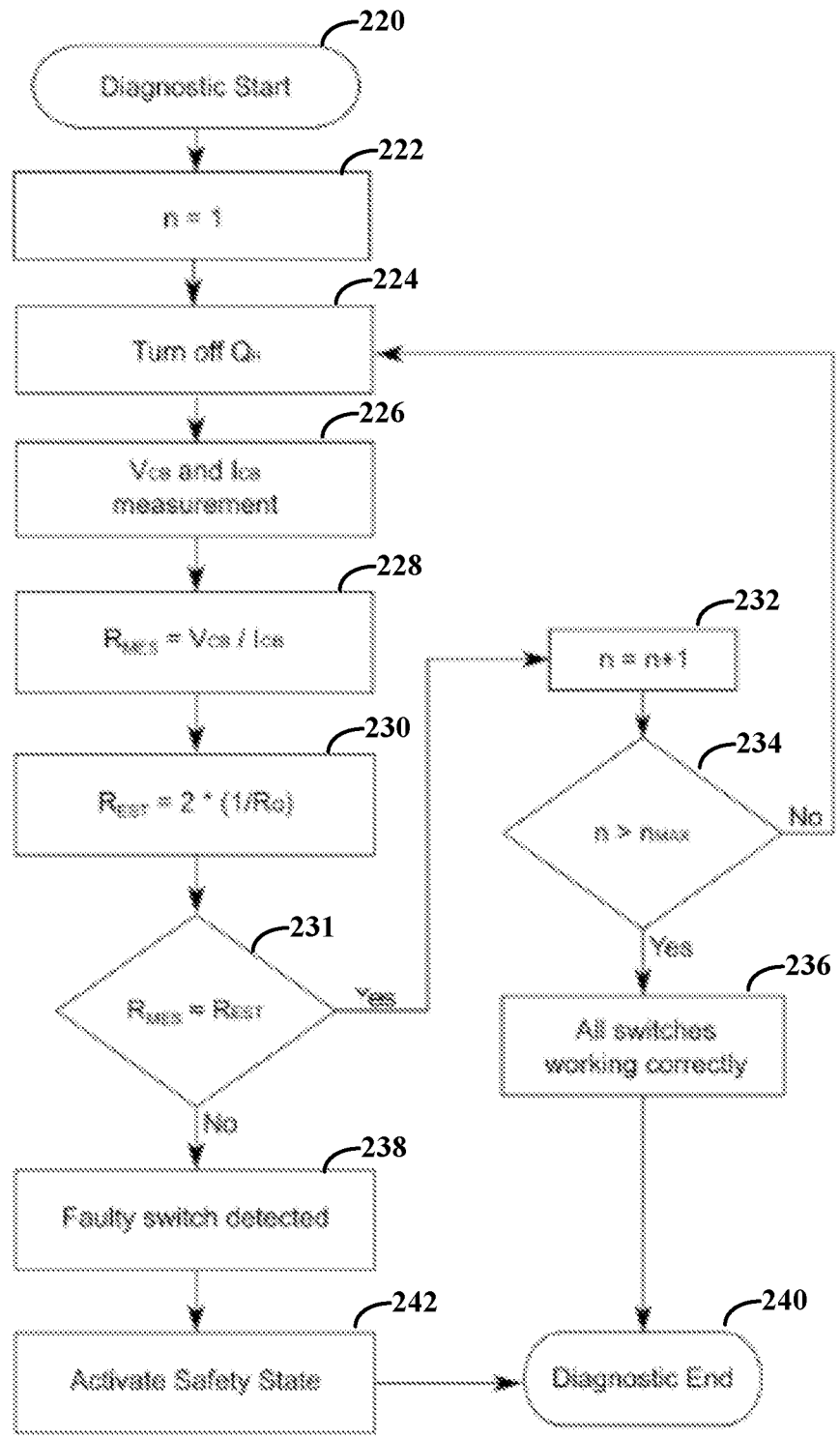
FIG. 2 illustrates an example method for modulating current paths of an electronic circuit breaker, in accordance with various embodiments.

FIG. 2 illustrates an example method for modulating current paths of an electronic circuit breaker, in accordance with various embodiments. The method illustrated by FIG. 2 can be implemented using the apparatus 100 illustrated by FIG. 1, although embodiments are not so limited. In the method, the use of the current paths is modulated via a predefined switching pattern associated with the field-effect power switches of the electronic circuit breaker. In the specific embodiments, the predefined switching pattern includes selectively turning off one of the field-effect power switches while the remaining field-effect power switches are activated.

At 220, the diagnostic process starts. In specific embodiments, the diagnostics can be performed periodically and/or can be initiated throughout the lifetime of the apparatus. The diagnostics can be performed at a variety of times, and is not limited to when the apparatus is in a standby-mode. Additionally, the field-effect power switches can have a soft-turn on to mitigate or prevent unwanted high currents and voltages during switching.

The diagnostics process, as described above, includes a predefined switching pattern. At 222, the particular field-effect power switch in the switching pattern that is to be deactivated is identified as number 1 (e.g., n=1). At 224, the identified field-effect power switch (e.g., $Q_1$) is turned off while the remaining field-effect power switches, e.g., $Q_2$-$Q_N$, are activated. Although, as described above, embodiments are not so limited and in some embodiments more than one switch is deactivated at a time. At 226, current $I_{CB}$ and voltage drop $V_{CB}$ associated with the particular current path of the electronic circuit breaker are measured. Using the current $I_{CB}$ and voltage drop $V_{CB}$ along the circuit breaker, at 228, the actual resistance $R_{MES}$ is determined based on $V_{CB}/I_{CB}$ The expected resistance $R_{EST}$, e.g., usage of power, is calculated or retrieved at 230, according to the number of active field-effect power switches and the resistance of the field-effect power switches by a datasheet or stored values in a table, such as stored on memory of the control circuitry. In the specific embodiments, such as illustrated by the apparatus of FIG. 1, the apparatus has three field-effect power switches and assuming one field-effect power switch is deactivated at a time, as illustrated by FIG. 2, the expected resistance $R_{EST}$ can include expected resistance $R_{EST}=2*(1/R_Q)$, where $R_Q$ is the resistance of each of the field-effect power switches. At 231, the actual resistance is compared to the expected resistance to assess the actual usage of power relative to the expected usage of power.

In response to determining that the actual resistance is the same or within a threshold of the expected resistance, the process can continue through the predefined switching pattern. For example, at 232, the next field-effect power switch (e.g., N+1) is determined. At 234, it is determined whether or not the next field-effect power switch (e.g., N=N+1) is greater than the number of field-effect power switches in the electronic circuit breaker (e.g., Nmax). If not, the process returns to 224 and turns off the next field-effect power switch (e.g., N=N+1) while activating the other field-effect power switches, measures the current and voltage drop at 226, determines the actual resistance at 228, determines the expected resistance at 230, and compares the actual to the expected resistance at 231. In response to determining the next field-effect power switch is greater than the number of field-effect power switches, at 236, it is determined that all of the field-effect power switches are operating correctly, and at 240, the diagnostics ends.

In response to determining that the actual resistance is not the same or within a threshold of the expected resistance, in some embodiments, a faulty switch is detected at 238 (e.g., it is determined that one of the switches is not operating properly). In a number of embodiments, after detecting a faulty switch, one or more actions can be taken, such as activating a safety mode for the apparatus at 242. In other embodiments, although not illustrated, in response to one of the switches not operating properly, the diagnostic pattern can be completed prior to ending the diagnostic process, at 240.

In a number of embodiments, the respective field-effect power switches can be activated and deactivated using a soft turn-on and/or turn-off. For example, the method can include selectively activating (soft-turn on) the field-effect power switches, wherein a deactivated field-effect power switch is activated over a threshold period of time. As a specific example, if all of the field-effect power switches of the electronic circuit breaker are turned-off, and one or more the field-effect power switches is activated without a soft turn-on, a current peak may occur that is greater than a threshold which may cause circuit damage or otherwise be problematic. To prevent a current peak, the respective field-effect power switch is turned on over the threshold period of time such that current is slowly let through.

As may be appreciated, method embodiments are not limited to that illustrated by FIG. 2. For example, in an apparatus for use with an electronic circuit breaker having a plurality of current paths connected between a connection terminal to a power source and a load terminal coupled to electronics, a method can include monitoring circuit access of power via the power source, via power access circuitry, by modulating use of the plurality of current paths of the electronic circuit breaker while assessing (e.g., measuring) actual usage of the power source via a power-related parameter relative to expected usage of the power source. Modulating the current path can include selectively activating and deactivating respective field-effect power switches in each of the plurality of current paths. More specifically, the modulation can include sequentially enabling current flow through each current path of the plurality of current paths while disabling current flow through at least one of the remaining plurality of current paths. In the specific embodiments, such as illustrated by FIG. 1, the electronic circuit breaker includes three field-effect power switches and modulating the use of the plurality of current paths of the electronic circuit breaker includes selectively deactivating at least one (or more than one) of the field-effect power switches while activating at least one of the field-effect power switches. In other embodiments, as illustrated by FIG. 2, one of the field-effect power switches is deactivated at a time. Alternatively and/or in addition, the method can include connecting the plurality of current paths to another load terminal during the modulation of the use of the plurality of current paths.

Assessing the actual usage of the power source via the power-related parameter further can include measuring one or more of a voltage drop and current associated with sequential activation of current flow through each current of the plurality of current paths, while disabling current flow through at least one of the remaining plurality of current paths. The voltage drop and the current associated with the sequential activation of current flow can be measured using different amplifiers. As previously described, the assessment can include determining the actual resistance of the circuit breaker using a voltage drop and current associated with the modulated use of the plurality of current paths and comparing the actual resistance values to expected resistance values according to the number of active field-effect power switches and the defined resistance value of the field-effect power switches.

The method can further include generating, in response to the modulation and assessment, a signal indicative of a diagnostic result associated with operation of the electronic circuit breaker and selectively using the signal to control operation of the (vehicle) electronics. As previously described, selectively using the signal can include placing the apparatus in a safety-operation mode that includes at least one of outputting an alert, disabling a function and limiting a value of a function provided by the electronics (e.g., notify driver of error on screen, limit speed, limit gears, turn off car, output message to external circuitry).

The above described diagnostics can cause a power loss to the electronic circuit breaker. However, the diagnostic time can be less than a threshold (e.g., a few milliseconds) and the impact be ignored.

Figure 3:
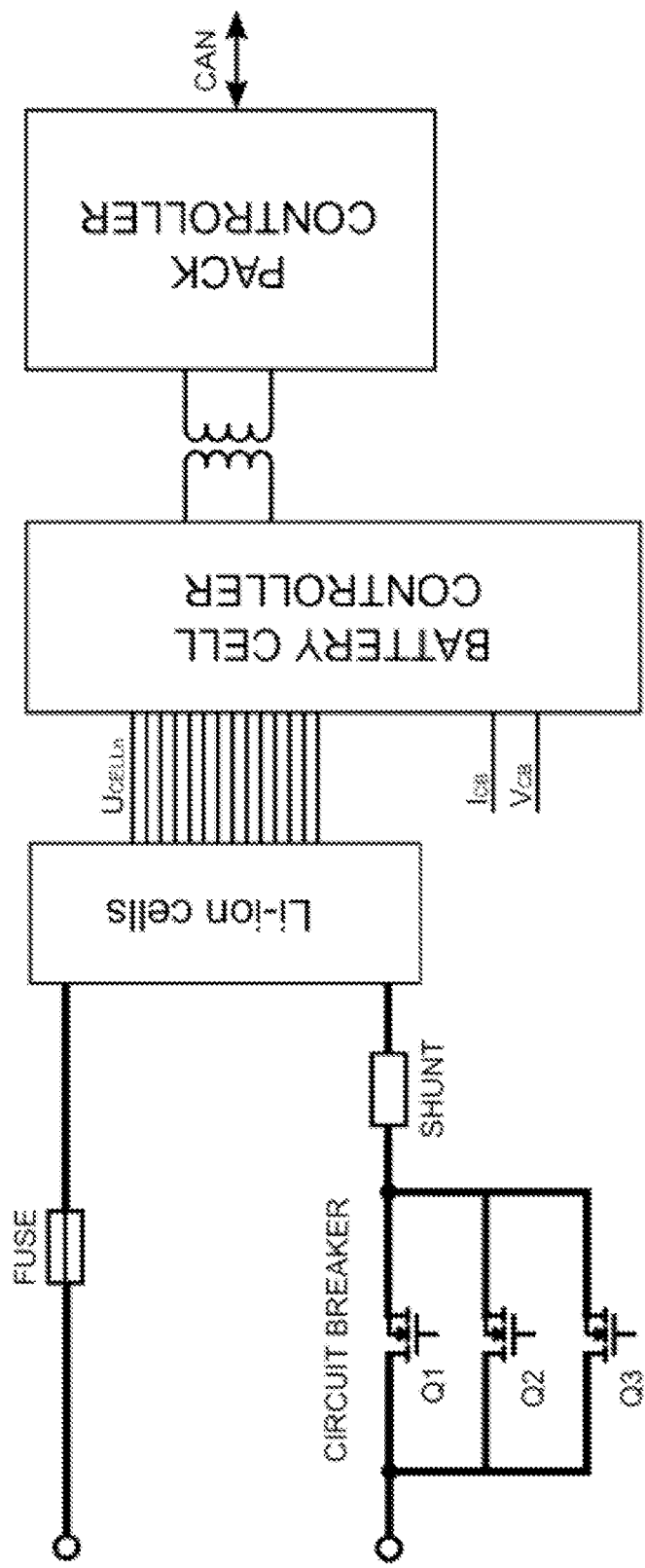
FIG. 3 illustrates an example apparatus including a battery management system with an electronic circuit breaker, in accordance with various embodiments.

FIG. 3 illustrates an example apparatus that includes a BMS with an electronic circuit breaker, in accordance with various embodiments. As illustrated, the BMS has an electronic circuit breaker that includes at least two field-effect power switches (e.g., Q1, Q2, Q3) used to disconnect electric power provided from a power source in the case of a fault. For voltages over 12V, typically the circuit breakers include a pre-charge circuit to allow for soft-turn on of the field-effect power switch(es) and to avoid current peaks. Embodiments in accordance with the present disclosure provide for the soft-turn on of the field-effect power switches without the use of a pre-charge circuit by linearly controlling the field-effect power switches. Additionally, the functionality of the electronic circuit breaker can be periodically assessed using a diagnostic pattern, as described above, and to achieve or verify functional safety levels according to a safety standard. While modulating the field-effect power switches via the diagnostic pattern, current and voltage drop across the field-effect power switches are measured and used to calculate actual resistance. The actual resistance is compared to an expected resistance value, which can be calculated according to the number of active field-effect power switches and the defined resistance value(s) of the field-effect power switches. Each of the field-effect power switches has a defined resistance when deactivated and activated, which is used to calculate the expected resistance. As described above, FIG. 3 illustrates a BMS, in accordance with various embodiments, in which the circuit breaker has a built in pre-charge capability without the use of pre-charging circuitry. The BMS can, in some embodiments, be a 48V BMS, although embodiments in accordance with the present disclosure are not so limited.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 102 of FIG. 1 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1 and 2. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described at FIG. 2 is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first field-effect power" a "second field-effect power switch," etc., where the field-effect power switch might be replaced with terms such as "circuit", "switch" and others, the adjectives "first" and "second" are not used to connote any description of the structure or to provide any substantive meaning; rather, such adjectives are merely used for English-language antecedence to differentiate one such similarly-named structure from another similarly-named structure.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, the apparatus 100 illustrated by FIG. 1 can include fewer or more circuit components. As another example, the method of FIG. 2 can include fewer or more steps, and can be implemented by an apparatus such as that illustrated by FIG. 1 or FIG. 3. Such modifications do not depart from the true spirit and scope of various aspects of the disclosure, including aspects set forth in the claims.

What is claimed is:

1. An apparatus for use with an electronic circuit breaker having a plurality of current paths configured and arranged to be connected between a first connection terminal to a power source which has the first connection terminal and a second connection terminal and a first load terminal of a load which has the first load terminal and a second load terminal, the apparatus comprising:

power access circuitry configured and arranged to monitor circuit access of power via the power source by modulating use of the plurality of current paths of the electronic circuit breaker by activating or deactivating one or more field-effect power switches which control current in one or more of the plurality of current paths while assessing actual power usage of the power source via a power-related parameter relative to expected power usage of the power source during the modulation, wherein the actual power usage is based on determining an actual resistance of the electronic circuit breaker by measuring a source voltage and drain voltage of each field-effect power switch and a current through a shunt resistor with one terminal directly coupled to the first connection terminal of the power source and another terminal directly coupled to a source of each of the field-effect power switches and the expected power usage is based on multiplying an indication of field-effect power switch resistance stored in memory of the apparatus by a number of the field-effect power switches which are activated, wherein the second load terminal of the load is connected to the second connection terminal of the power source; and control circuitry configured and arranged to determine whether or not one of the field-effect power switches is faulty based on the assessment and generate a signal indicative of a diagnostic result associated with operation of the electronic circuit breaker based on the determination.

2. The apparatus of claim 1, further including a field-effect power switch in each of the plurality of current paths and the power source, wherein the power source includes a battery, and wherein the power access circuitry is further configured and arranged to modulate use of the plurality of current paths by selectively disabling current flow relative to less than all of the plurality of current paths.

3. The apparatus of claim 1, further including the power source, wherein the power source includes a plurality of batteries.

4. The apparatus of claim 1, further including vehicle electronics, and a safety-module circuit coupled to the vehicle electronics, the safety-module circuit and the vehicle electronics cooperatively configured and arranged to use the signal indicative of the diagnostic result by causing the vehicle electronics to enter into a safety vehicle-operation mode.

5. The apparatus of claim 1, further including a field-effect power switch in each of the plurality of current paths and wherein the power access circuitry is further configured and arranged to modulate the use of the plurality of current paths of the electronic circuit breaker via a predefined switching pattern associated with the field-effect power switches that selectively disables current flow to less than all of the plurality of current paths.

6. The apparatus of claim 1, wherein the control circuitry is configured and arranged to generate the signal indicative of a detected fault associated with at least one of the plurality of current paths.

7. The apparatus of claim 1, further including a field-effect power switch in each of the plurality of current paths and wherein the power access circuitry is further configured and arranged to modulate the use of the plurality of current paths of the electronic circuit breaker via a predefined switching pattern associated with the field-effect power switches that selectively deactivates at least one of the field-effect power switches while activating one of the field-effect power switches.

8. The apparatus of claim 1, wherein the power access circuitry is further configured and arranged to connect the plurality of current paths to another load terminal of another load during the modulation of the use of the plurality of current paths while the diagnostic result is generated and disconnect the plurality of current paths to the other load terminal of the other load after the diagnostic result is generated and to connect the plurality of current paths to only the first terminal of the load, wherein further connecting the plurality of current paths to the other load terminal increases current of the plurality of current paths to generate the diagnostic result compared to connecting the plurality of current paths to only the first terminal of the load.

9. The apparatus of claim 1, wherein the expected usage of the power source is predefined and varies based on a number of current paths being used at a same time.

10. The apparatus of claim 1, wherein the power access circuitry is further configured and arranged to deactivate or activate two or more of the field-effect power switches at a same time, wherein the first field-effect power switch is in a first current path and the second field-effect power switch is in a second current path and the control circuitry is configured and arranged to determine whether or not one of the field-effect power switches is faulty based on the deactivation or activation of the two or more of the field-effect power switches at the time.

11. The apparatus of claim 5, the power access circuitry including a sequencer circuit configured and arranged to generate and provide the predefined switching pattern.

12. A non-transitory computer readable medium containing program instructions when executed by a processor cause the processor to perform a method including:
causing modulated use of a plurality of current paths of an electronic circuit breaker by activating or deactivating one or more field-effect power switches which control current in one or more of the plurality of current paths, the current paths being connected between a first connection terminal to a power source which has the first connection terminal and a second connection terminal and a first load terminal of a load which has the first load terminal and a second load terminal, the load coupled to electronics, wherein the second load terminal of the load is connected to the second connection terminal of the power source;
assessing actual power usage of the power source via a power-related parameter relative to expected power usage of the power source during the modulation, wherein the actual power usage is based on determining an actual resistance of the electronic circuit breaker by measuring a source voltage and drain voltage of each field-effect power switch and a current through a shunt resistor with one terminal directly coupled to the first connection terminal of the power source and another terminal directly coupled to a source of each of the field-effect power switches and the expected power usage is based on multiplying an indication of field-effect power switch resistance stored in memory of the apparatus by a number of the field-effect power switches which are activated;
determining whether or not one of the field-effect power switches is faulty based on the assessment; and
generating, in response to the determination, a signal indicative of a diagnostic result associated with operation of the electronic circuit breaker and selectively using the signal to control operation of the electronics.

13. In an apparatus for use with an electronic circuit breaker having a plurality of current paths configured and arranged to be connected between a first connection terminal to a power source which has the first connection terminal and a second connection terminal and a first load terminal of a load which has the first load terminal and a second load terminal, the load coupled to electronics, a method comprising:
monitoring circuit access of power provided from the power source, via power access circuitry, by modulating use of the plurality of current paths of the electronic circuit breaker by activating or deactivating one or more field-effect power switches which control current in one or more of the plurality of current paths while assessing actual power usage of the power source via a power-related parameter relative to expected power usage of the power source during the modulation, wherein the actual power usage is based on determining an actual resistance of the electronic circuit breaker by measuring a source voltage and drain voltage of each field-effect power switch and a current through a shunt resistor with one terminal directly coupled to the first connection terminal of the power source and another terminal directly coupled to a source of each of the field-effect power switches and the expected power usage is based on multiplying an indication of field-effect power switch resistance stored in memory of the apparatus by a number of the field-effect power switches which are activated, wherein the second load terminal of the load is connected to the second connection terminal of the power source;
determining whether or not one of the field-effect power switches is faulty based on the assessment; and
generating, in response to the determination, a signal indicative of a diagnostic result associated with operation of the electronic circuit breaker and selectively using the signal to control operation of the electronics.

14. The method of claim 13, wherein selectively using the signal further includes placing the electronics in a safety-operation mode that includes at least one of outputting an alert, disabling a function and limiting a value of a function provided by the electronics.

15. The method of claim 13, wherein modulating use of the plurality of current paths further includes selectively activating and deactivating respective field-effect power switches in each of the plurality of current paths.

16. The method of claim 13, wherein the plurality of current paths each includes a field-effect power switch and the modulation further includes selectively activating the field-effect power switches using linear control of the field-effect power switches, wherein a deactivated field-effect power switch is activated over a threshold period of time.

17. The method of claim 13, wherein modulating use of the plurality of current paths further includes sequentially enabling current flow through each current path of the plurality of current paths while disabling current flow through at least one of the remaining plurality of current paths.

18. The method of claim 13, wherein assessing the actual power usage of the power source via the power-related parameter further includes measuring a voltage drop across each field-effect power switch and current through a shunt resistor coupled to the connection terminal of the power source and source of each of the field-effect power switches, the voltage drops and current associated with sequential activation of current flow through each of the plurality of current paths, while disabling current flow through at least one of the remaining plurality of current paths.

19. The method of claim 13, wherein the electronic circuit breaker includes three field-effect power switches and modulating the use of the plurality of current paths of the electronic circuit breaker includes selectively deactivating one or more of the field-effect power switches while activating one of the field-effect power switches.

20. The method of claim 13, wherein assessing actual power usage of the power source includes determining the actual resistance of the electronic circuit breaker using a ratio of voltage drop across each field-effect power switch based on the source voltage and drain voltage of each field-effect power switch and current through the shunt resistor coupled to the first connection terminal of the power source and the source of each of the field-effect power switches, the voltage drops and current associated with the modulated use of the plurality of current paths and comparing the actual resistance values to the expected resistance values; and wherein determining whether or not one of the field-effect power switches is faulty is based on the comparison indicating that the actual resistances values is not within a threshold amount of the expected resistance values.

21. The method of claim 13, further including connecting the plurality of current paths to another load terminal of another load during the modulation while the diagnostic result is generated and disconnecting the plurality of current paths to the other load terminal of the other load after the diagnostic result is generated and to connect the plurality of current paths to only the first terminal of the load, wherein further connecting the plurality of current paths to the other load terminal increases current of the plurality of current paths to generate the diagnostic result compared to connecting the plurality of current paths to only the first terminal of the load.

22. The method of claim 18, wherein the voltage drop and the current associated with the sequential activation of current flow are measured using different amplifiers.

* * * * *